United States Patent [19]

Ward

[11] Patent Number: 4,498,716
[45] Date of Patent: Feb. 12, 1985

[54] DATA MONITORING CONNECTOR FOR TESTING TRANSMISSION LINKS

[76] Inventor: Marvin W. Ward, 7838 Goldphin Dr., Springfield, Va. 22153

[21] Appl. No.: 364,231

[22] Filed: Apr. 1, 1982

[51] Int. Cl.³ .................. H01R 9/09; G06F 11/30
[52] U.S. Cl. .................. 339/17 R; 324/158 F; 371/22; 371/24
[58] Field of Search .......... 339/17 R, 17 L, 17 C, 339/18 R, 18 C, 157 R, 157 C; 324/73 R, 158 F; 361/399, 410, 415; 371/22, 24, 27; 200/292

[56] References Cited

U.S. PATENT DOCUMENTS

| | | | |
|---|---|---|---|
| 2,565,075 | 8/1951 | Harcharek | 339/155 R |
| 3,029,367 | 4/1962 | Tomonoh et al. | 361/399 |
| 3,267,407 | 8/1966 | Humphries et al. | 339/18 R |
| 3,568,136 | 3/1971 | Wells | 339/156 R |
| 3,808,523 | 4/1974 | Yuska | 324/158 F |
| 3,867,672 | 2/1975 | Pizzigoni | 339/17 C |
| 3,885,854 | 5/1975 | Reimer | 324/158 F |
| 4,057,520 | 11/1977 | Schwartz | 200/292 |
| 4,392,701 | 7/1983 | Weidler | 339/156 R |

FOREIGN PATENT DOCUMENTS 1285352  1/1962  France ................ 339/157 R

OTHER PUBLICATIONS

IBM Bulletin, Martin, vol. 4, No. 5, p. 33, 10-1961.
Electronics, Dip Switch, Dougherty, p. 112, 5-15-1975.

Primary Examiner—Neil Abrams
Attorney, Agent, or Firm—Lowe King Price & Becker

[57] ABSTRACT

Known data patterns are injected and received at various points along a data link using a special data monitoring connector at least at two pieces of equipment in the link. Each connector includes a housing containing a circuit board upon which is printed conductors corresponding to the various lines of a standard interface. Terminal elements mounted on the board in contact with the printed conductors are exposed through the surface of the housing to enable data on the lines to be monitored without interferring with data flow. A switch module in circuit with each printed conductor on the circuit board controls data flow through each conductor and each conductor is further provided with a discontinuity across which a jumper is selectively connected. The known data pattern is injected into the connector data monitoring terminals at one of the pieces of equipment and is either received from the connector data monitoring terminals of another piece of equipment or is monitored at the first data monitoring terminals following "loop-back" of the monitoring terminals at another piece of equipment, depending upon the section of transmission link being tested. The injected and received data patterns are compared in a conventional manner to identify data transmission error.

11 Claims, 11 Drawing Figures

U.S. Patent   Feb. 12, 1985   Sheet 1 of 5   4,498,716
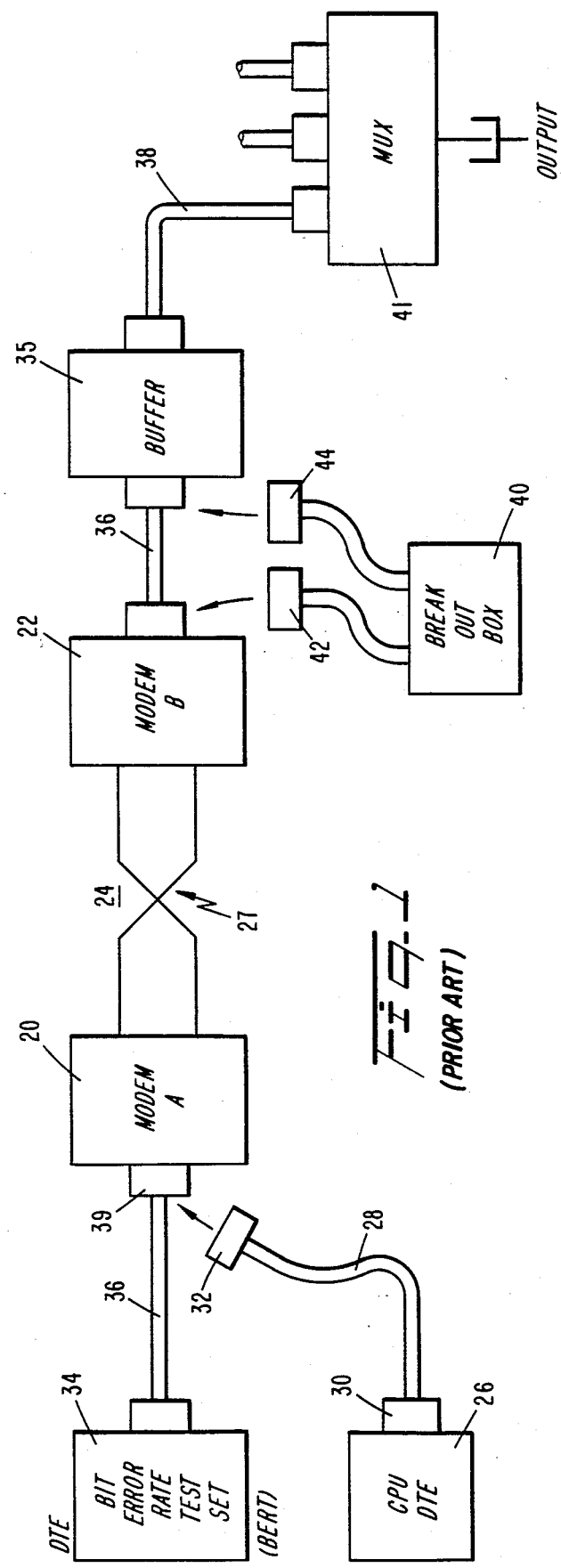
_Fig. 1_ (PRIOR ART)
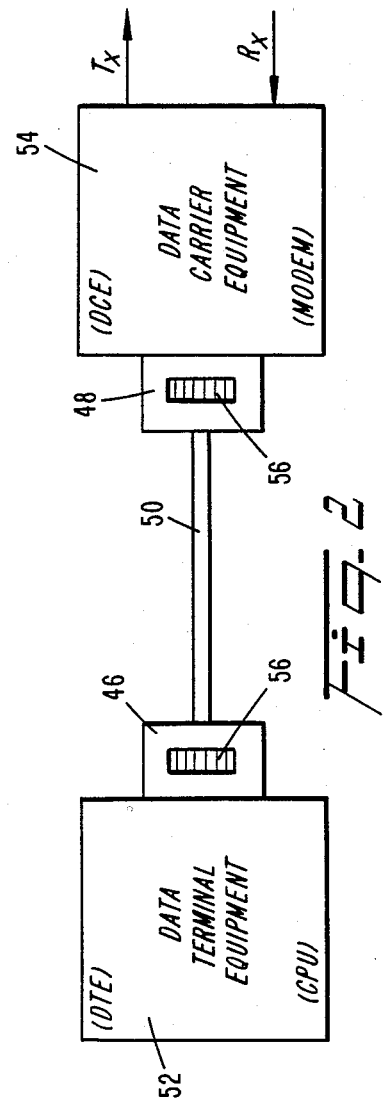
_Fig. 2_

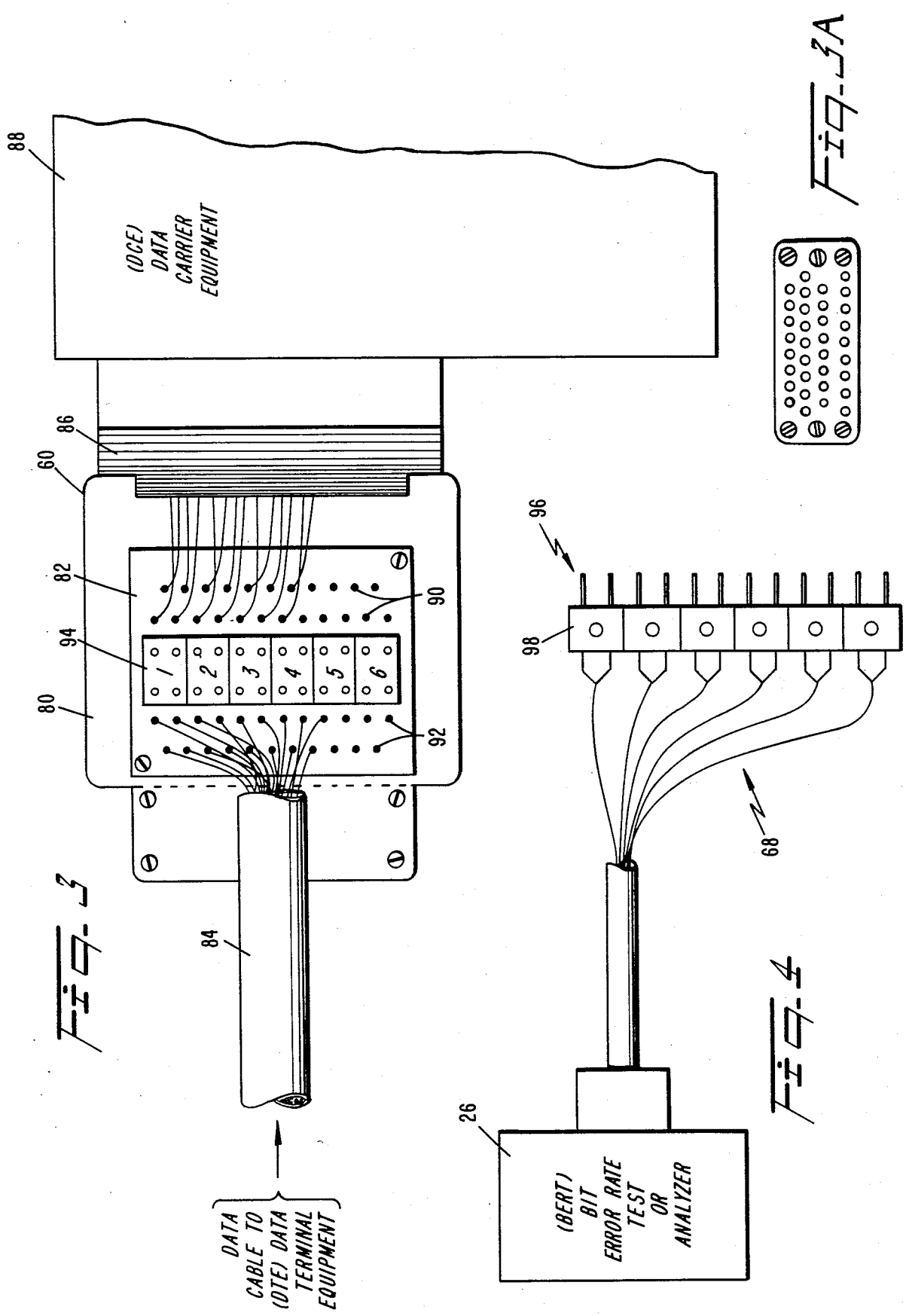

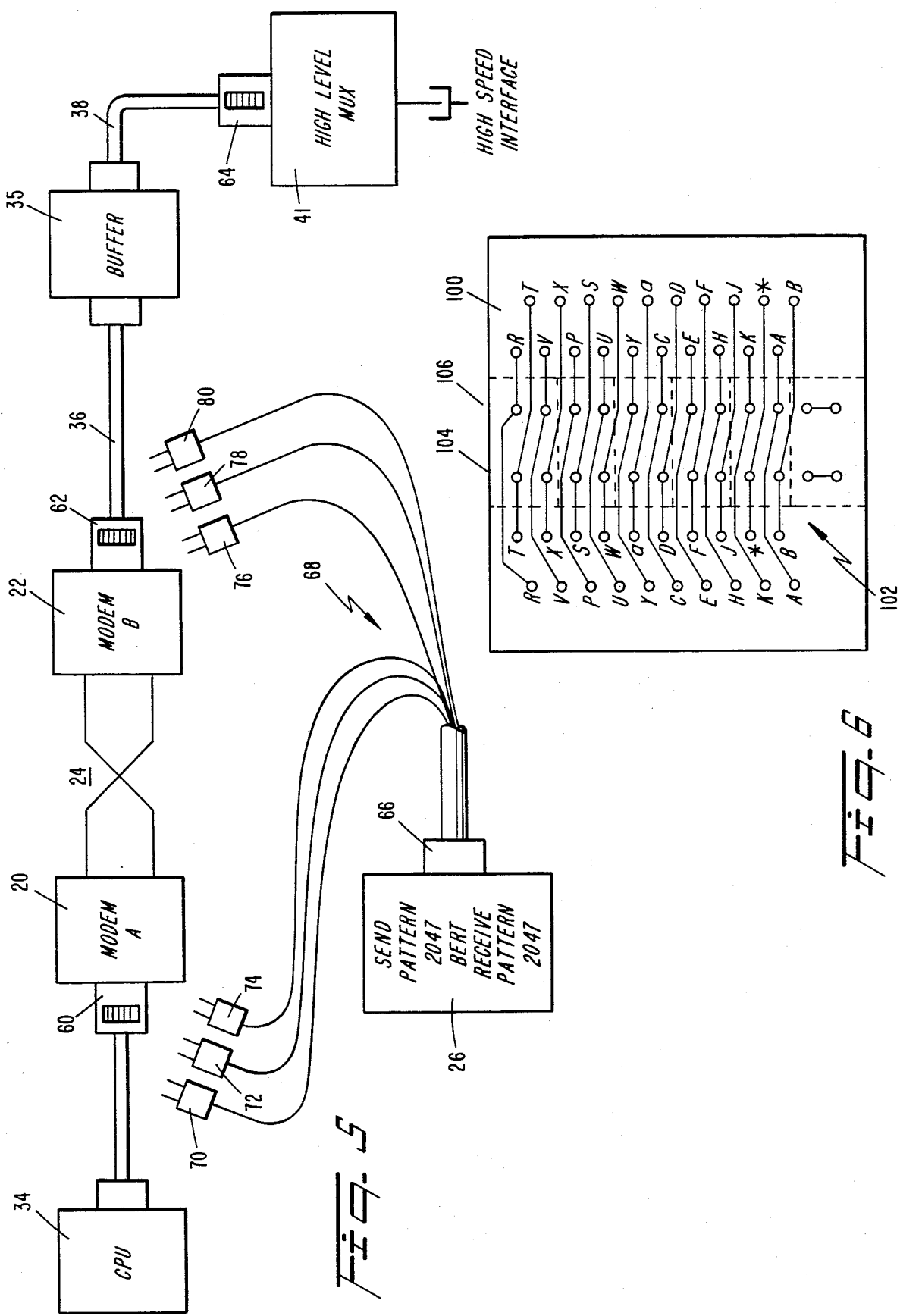

DATA MONITORING CONNECTOR FOR TESTING TRANSMISSION LINKS

FIELD OF THE INVENTION

The present invention relates generally to testing of data transmission links in multiple cable, computer based systems, and more particularly, toward a new testing method using a special data monitoring connector provided at least at two pieces of equipment on the link to enable monitoring of data flow without breaking the link or otherwise interrupting data flow.

BACKGROUND ART

Data communications systems involve terminal installations as well as interconnecting networks that enable exchange of data from one point to another along a data transmission link. The link comprises a number of interconnected terminals forming a system network. The data links forming the network involve large numbers of balanced and un-balanced data transmission conductors that are usually provided as multi-paired cables that extend among data communication equipment and provide the transmission medium for electronic signals that pass between data terminating devices.

Various types of transmission protocols, called interfaces, in data transmission links have become standardized. Typical standards, depending upon bit transmission rate, are EIA-RS-232C, EIA-RS449 and CCITT type V.35. Each of these types of interfaces contains unique mechanical as well as electrical design parameters. In each, data signals are transmitted via conductors in cables through special interface connectors. The data signals comprise data, timing (clock) signals and control signals according to specific values.

To troubleshoot data transmission problems in industrial data transmission systems, wherein data are communicated between at least one central processing unit (CPU) and a multiplicity of data facilities, such as modems, line drivers and multiplexers, access to signals on each of the conductors within the interface must be monitored. Typically, a standard bit error rate transmitter (BERT) is applied to inject a known binary pattern to one portion of the interface and another BERT receives the data at another point of the interface. The two BERTs are synchronized to inject and respond to the same binary pattern, and an analysis is made to identify bit error rate. For example, to inject the binary data stream at one end of the interface, the CPU is disconnected and replaced by the BERT. Elsewhere along the interface, at a position that depends upon the particular portion of the interface and facilities to be tested, the interface must be opened and a standard breakout box inserted having exposed conductors corresponding to the interface conductors. The second BERT is connected in circuit with the interface through the breakout box.

The provision of two separate BERTs in the facility and incorporation of the breakout box into the interface creates substantial difficulties in testing Synchronization of the two BERTs requires an in depth knowledge of the clocking arrangement of the interface, and the two BERT sets must be conditioned to match the facilities. In some systems with loop clock, the task is almost impossible without using a breakout box to configure and provide these special clock arrangements. Substantial knowledge of the system and considerable time are therefore required.

DISCLOSURE OF INVENTION

It is, accordingly, one object of the invention to provide a new and improved system for testing communications interfaces.

It is another object to provide a new and improved method of testing communications interfaces without interrupting data flow or opening the interface.

Another object is to provide a new and improved method of testing communications interfaces using a single BERT, whereby synchronization of timing and data is avoided.

The test method, in accordance with the invention, includes providing a special connector secured to at least two pieces of equipment within the data transmission system. Each connector includes a housing having a plurality of terminal elements extending from the housing to be coupled to corresponding terminal elements of the interface. Data access terminals are coupled to the terminal elements and are positioned to be accessed from outside the housing. A known binary pattern is injected into the connector data access terminals of one piece of equipment and received at the connector data access terminals of another piece of equipment, depending upon the section of the interface being tested. The injected and received data patterns are correlated in a conventional manner to determine bit error rate. Alternatively, the data pattern signal may be injected into the interface at the connector data access terminals of one piece of equipment. At the connector data access terminals of another piece of equipment, the data pattern signal is looped back and the signal is received at the connector data access terminals of the first piece of equipment where bit error rate analysis is made. In either case, testing requires only one BERT, and data flow is never interrupted. Furthermore, testing can be conducted by less skilled personnel since it does not require selecting from among the myriad wires in a standard breakout box carrying particular timing signals, etc. necessary for monitoring.

Another object of the present invention, therefore, is to provide a novel interface connector secured to equipment and having data access terminals to enable interface signals to be monitored without disconnecting the connector or otherwise interrupting data flow.

Another object is to provide such a connector that is easily manufactured and conveniently used in an industrial environment.

BRIEF DESCRIPTION OF THE DRAWINGS

FIG. 1 is a simplified diagram of a data interface testing method of the type used in the prior art and over which the present invention is an improvement;

FIG. 2 is a simplified diagram showing two pieces of equipment interconnected by an interface cable and a pair of novel data monitoring connectors used in the present invention;

FIG. 3 is a more detailed illustration of one of the data monitoring connectors attached to a piece of equipment in the data interface;

FIG. 3A is a pin diagram of a standard V.35 connector;

FIG. 4 illustrates a bit error rate tester (BERT) including connectors adapted to couple with corresponding access terminals in the data monitoring connector shown in FIG. 3;

FIG. 5 is a simplified diagram showing interface testing in accordance with the invention;

FIG. 6 is a diagram of one embodiment of a printed circuit board used in a data monitoring connector;

Figure 7:
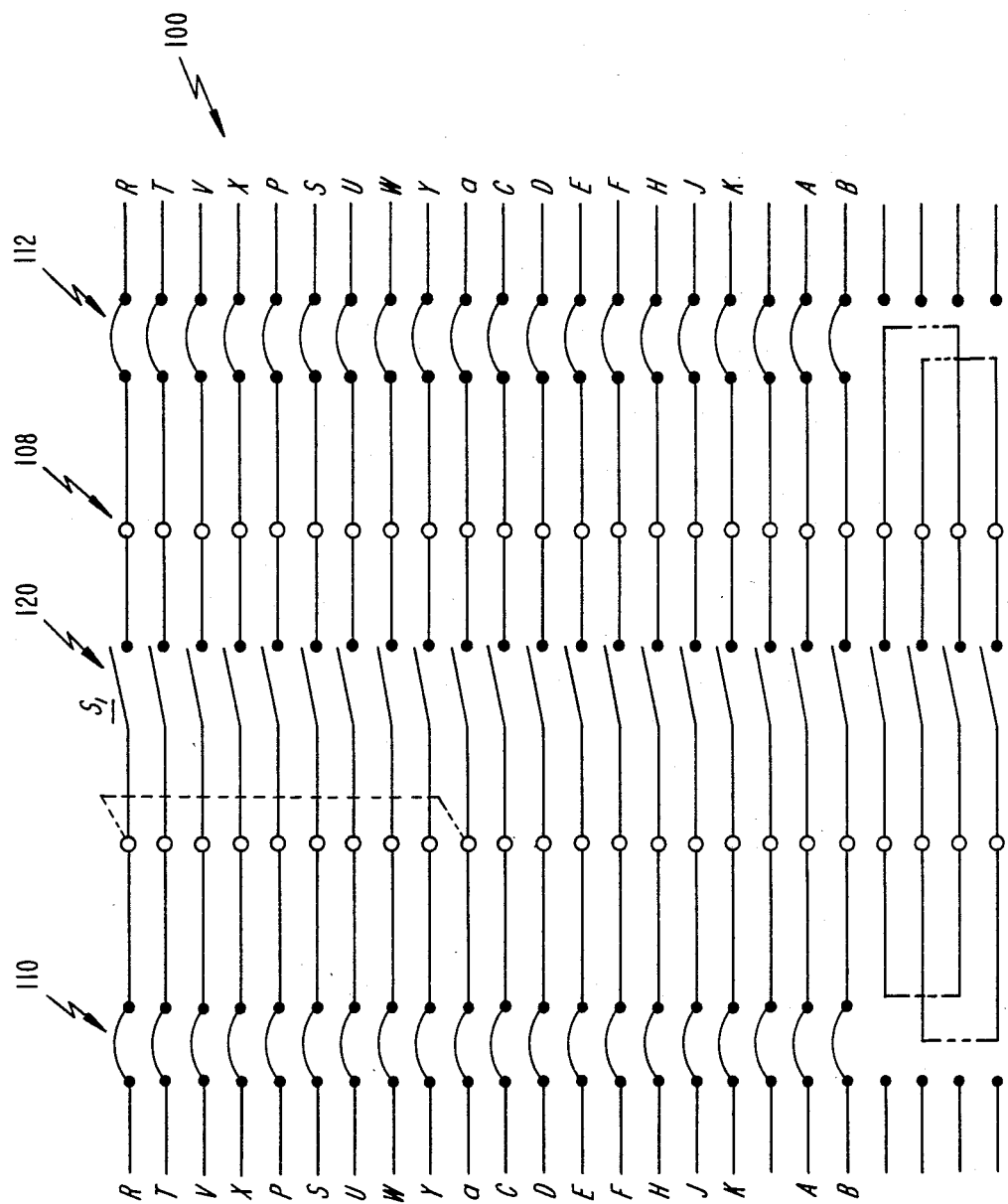
FIG. 7 is a wiring diagram of a data monitoring and breaking connector, in accordance with another aspect of the invention.

Still other objects and advantages of the present invention will become readily apparent to those skilled in this art from the following detailed description, wherein I have shown and described only the preferred embodiments of the invention, simply by way of illustration of the best modes contemplated by me of carrying out my invention. As will be realized, the invention is capable of other and different embodiments, and its several details are capable of modification in various, obvious respects, all without departing from the invention. Accordingly, the drawings and description are to be regarded as illustrative in nature, and not as restrictive.

BEST MODE FOR PRACTICING THE INVENTION

With reference to FIG. 1, in the industry standard method of testing interface circuits in data communications systems wherein signals are transferred between data communications equipment (DCE) and data terminal equipment (DTE), a pair of modulator-demodulator units (modems) 20, 22 are connected on opposite ends of a data interface cable 24 having a standard crossover at 27. The modem 20 normally receives data from data terminal equipment 26, which in the example shown is a central processing unit (CPU). Data from this CPU 26 are bidirectionally coupled to modem 22 through data cable 28 via conventional couplings 30 and 32.

At the opposite end of interface cable 24, the modem 22 is bidirectionally coupled to a buffer 35 through a standard EIA interface cable 36. The buffer 35 in turn may be coupled to a multiplex unit 41 through another standard EIA interface cable 29. The multiplex unit 41 may be coupled to other facilities such as a microwave link or wideband modulator-demodulator.

To test data transmission throughout the transmission link facility shown in FIG. 1, a standard bit error rate test set (BERT) is applied to the input of modem 20 to inject a known binary pattern. The CPU 26 is disconnected from the input of modem 20 by removing coupling 32 and connecting the BERT 34 to the modem through standard EIA interface 36 and coupling 39. All send/receive data and control signals are located in the various multi-pair cables of the interfaces and are therefore not accessible. For this reason, to obtain access to such signals, it has been necessary to "break" the interface and insert in the data link a conventional breakout box 40. Convex V.35 Data Analyzer. Breakout box 40 has a pair of connectors 42, 44 to be connected in circuit with modem 22 and buffer 35 at interface 36. The breakout box 40, although not shown in detail. for brevity, contains an array of conductors, switches and terminals to enable signal flow paths normally flowing within the interface 36 to be interrupted, looped back or passed through, and enables particular signals to be monitored.

To test the transmission link, a second BERT (not shown) is connected in circuit with the breakout box 40, and arranged to receive standard pattern data injected into the communications link by BERT 34. Both BERTs must be conditioned to match data protocol at the transmission line facility, and the two BERTs must be synchronized for common clocking. Because it is difficult to configure and provide the special clocking arrangements, it is virtually impossible to obtain direct access to the conductor pairs without a breakout box. Unfortunately, when a breakout box is applied to the system, the link must be interrupted by opening interface 36. Furthermore, the breakout box 40 is a relatively expensive piece of equipment and is large, limiting transportability.

In accordance with one aspect of the invention, as shown in FIG. 2, particular pieces of equipment, and in general, at least two pieces, are provided with special connectors 46, 48 to electrically couple each end of the interface cable 50 to equipment. In the example shown, connector 46 couples one end of interface 50 to CPU 52 while connector 48 couples the opposite end of the interface 50 to modem 54. Each connector 46, 48 is permanently coupled to the interface cable 50 and is releasably coupled to the piece of equipment 52, 54, respectively. Each connector could be of the male or female type. Each could further be permanently affixed to the equipment and adapted to receive a corresponding but opposite gender connector permanently wired to the interface cable 50. Of particular importance in either case, the body of each connector 46, 48 carries a set of data access terminals 56 to enable the data on each conductor of interface 50 to be monitored from outside the connector. This is in contrast to prior art connectors such as the Positronics CCITT V.35 which are provided with a hood that must be removed to expose individual conductor pairs of the interface. Access to data carried by each cable, however, must be made by carefully selecting the correct conductor from among the wire bundle, and access is made by piercing through insulation or probing for the bare conductors.

In accordance with the present invention, as shall be described in detail below, selected conductors of the interface cable are electrically connected to data access terminals which are exposed through the housing of each connector 46, 48 to enable access of data directly, i.e., without opening the connector or interrupting data flow. This is considered a significant departure from the prior art, not only because data signals are able to be accessed without requiring a breakout box or delicate probing but because the provision of the externally accessible data carrying terminals enables not only monitoring of interface data without interrupting data flow but allows control of data flow paths, i.e., interruption, crossover and loop back.

The term "interruption" is defined herein as the ability to selectively make or break signal flow along each of any number of selected conductors using, for example, mechanical switching. The term "crossover" is defined herein as crossing the signal flow path between two conductors as is necessary, for example, when interconnecting two modems (see crossover 26 in FIG. 1). The term "loop back" is defined as transferring data from one conductor to another while changing direction of the data flow so that it "loops back" to its origin.

Thus, referring to FIG. 5, in accordance with the present method of testing communications links, the facilities (equipment) and data links all remain in tact, with test data being injected, routed, and received via the data access terminals of each interface connector. Modem 20 is equipped with data monitoring connector 60, modem 22 is equipped with data monitoring connector 62 and high level multiplex 38 is equipped with data monitoring connector 64. Buffer 35 could be equipped with a data monitoring connector, but the connector has been omitted from the figure to illustrate that not all pieces of equipment in the communications link must be equipped with such connectors. Similarly, CPU 34 is not equipped with a data monitoring connector although it optionally could be.

BERT 26 is, again, a standard bit error rate test set that is provided with a conventional data connector 66 having a special test cable 68 that enables the signal transmit as well as receive and timing signals to be selectively connected to corresponding conductors on the communications link.

Thus, in FIG. 5 (see also FIG. 4), the test cable 68 is provided with different connectors to be coupled to the communications link, namely, send data plug 70, send clock plug 72 and send protocol 74. In addition, the test cable 68 has receive data plug 76, receive clock plug 78 and receive protocol 80. These six plugs provide all necessary data to test any interface. For example, the send plugs 70, 72 and 74 may be applied to corresponding data monitoring terminals of connector 60, with receive plugs 76-80 being applied to the corresponding monitoring terminals of connector 62. The binary pattern injected into plug 60 by BERT 26 passes through modem 20, along link 24 and through modem 22 to be received and returned to the same BERT for correlation. The correlation will identify the bit error rate associated with the two modems 20, 22 and link 24. Significantly, only one BERT is required, as contrasted with the prior art wherein two BERTs and a breakout box have been required.

To test interface 36, buffer 35 and interface 38, the test pattern from BERT 26 may be injected into the monitoring terminals of connector 62 and the signals received at the monitoring terminals of connector 64.

As another possibility, the test data pattern may be injected at one connector, looped back at a second connector and received at the first connector. This would be accomplished by, for example, by applying the send plugs 70-74 as well as receive plugs 76-80 to connector 60. At another connector, such as connector 62, a jumper may be provided, in a manner set forth below, to loop back the binary test pattern so that it will be received by the BERT 26 for correlation.

It is apparent that by proper application and reception as well as routing of test pattern signals, any piece or pieces of equipment or interface can be tested without data flow interruption or other problems associated with interface test methods of the prior art.

Referring to FIG. 3, a more detailed view of one of the data monitoring connectors, such as 60, is shown in more detail. The connector 60 has a housing 80 supporting a printed circuit board or other printed pattern carrier 82. One end of the housing 80 is mechanically coupled to a data cable 84 carrying the interface signals; the other end of the housing is provided with male or female connector coupling 86 that couples to the equipment such as DCE 88. The individual coupling of connection coupling 86 are wired to terminals 90 of the circuit board 82, and similarly, the conductors of cable 84 are wired to terminals 92. Signal flow paths between corresponding terminals 90, 92 are established through matrix 94. These connections are established by jumpers or by modular switches, not shown in FIG. 3, but to be discussed below. In FIG. 3, the matrix 94 is shown in the form of an array of female connectors adapted to receive the male terminals 96 of connector 98 of BERT 26. The connector block 98 in FIG. 4 is illustrated as a single block; it is understood, however, that the terminals can be separated, in the manner shown in FIG. 5, to enable selective application of test signals from BERT 26 to particular conductors of the interface 84.

An example of a printed circuit board supported within the housing of connector 60, shown in FIG. 6, comprises an insulating substrate 100 onto which is printed circuit pattern 102. The pattern 102 comprises an array of conductors that establish connections between corresponding input and output terminals, such as R—R and T—T which, in CCITT format, relate, respectively, to the receive data lines. Similarly, the conductors P—P and S—S in the same standard identify the transmit data signal lines. The terminals R, T are preferably solder terminals that receive incoming and outgoing cable ends.

A central portion of the board 100 contains two columns of terminals 104, 106. The first column 104 of terminals is in circuit with alternate conductors T—T, X—X, etc. whereas the second column of terminals 106 is connected to the opposite conductors R—R, V—V, etc. These terminals 104, 106 function as data access terminals which are accessible through the housing of each connector, such as connector 60, or are provided with terminals or extenders to enable the interface signals to be accessible from outside the connector. Preferably, the terminals 104, 106 are of a tyoe to receive terminal pins, such as pins 96 shown in FIG. 4, coupled to BERT 26. Of course, other forms of terminals 104, 106 could be provided to receive jumpers or measurement probe tips.

In accordance with another embodiment of the invention, shown in FIG. 7, the circuit board 100 may be provided with a somewhat more complex array of conductors and terminals. Thus, the circuit diagram 108 shown in FIG. 7 includes, besides the standard interface conductors, depending upon the particular standard, input and output terminals 110, 112, respectively. These terminals establish a transmission gap at the input and output of each conductor and are adapted to receive jumpers to selectively close or open the discontinuity in the conductor. Also, the discontinuity may be jumpered across conductors for rollover. A typical application of rollover is where the receive data and transmit data conductors are cross connected as in crossover 26 of FIG. 1. Rollover is provided by electrically connecting jumpers between conductors R—R and P—P and between conductors T—T and S—S. The jumpers may be temporarily connected but are preferably permanently connected, in circuit, by soldering.

A switch 121 is provided in each conductor. This enables the signal flow path in each interface cable to be controlled. For example, each loop back of a transmitted signal may be provided by opening the switch 112 is conductor a and connecting a jumper from the signal side of the open switch to conductor R at the same side of the switch, as shown in the dotted line.

Figure 8:
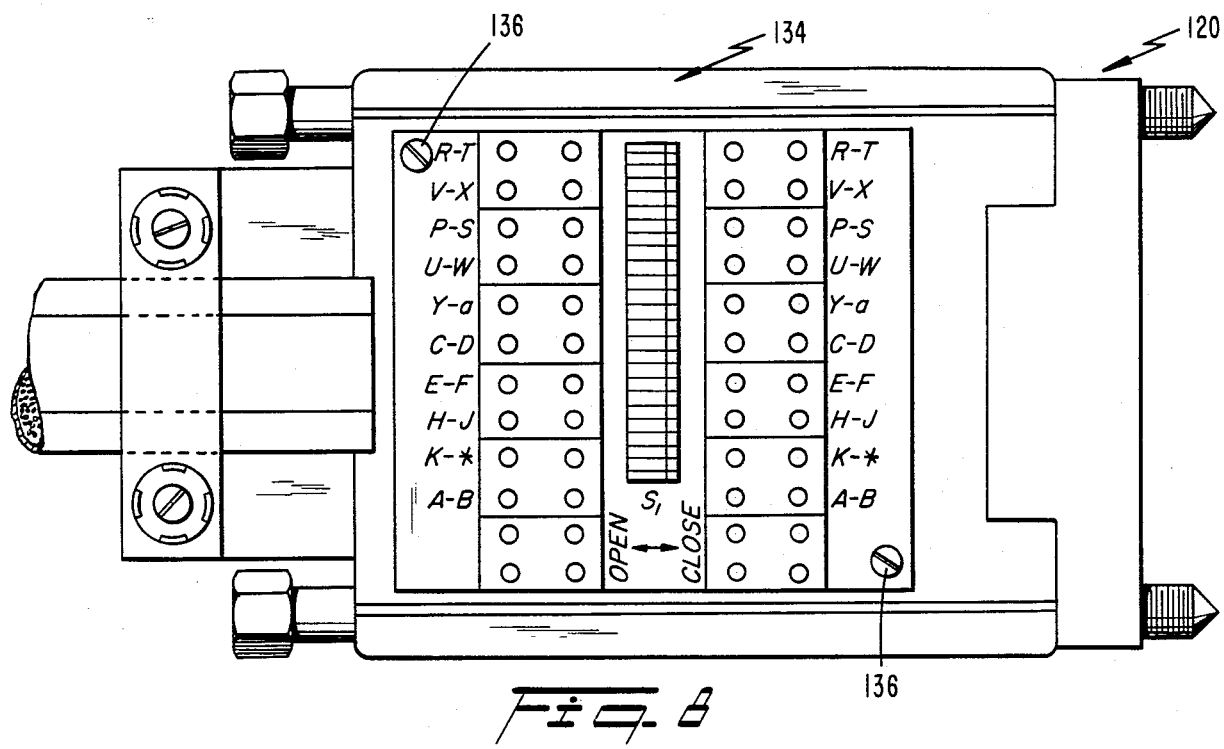
FIG. 8 is a detailed view of a data monitor and breaker, in accordance with the invention.

Referring to FIG. 8, connector 120 is similar to connector 60 in FIG. 4, with the addition of a group of modular switches 120 that correspond to the schematic switches 120 in FIG. 7. The switches are preferably of a type similar to the standard 7000 series, manufactured by Amp Corporation. Connector 134 is also a standard type, such as a CCITT V.35 connector, modified to support the terminals and switches shown. A pin diagram of the standard V.35 connector, with at least three rows of pins, is shown in FIG. 3A. Circuit board 100 is preferably supported within the housing 130 by insulating standoffs 136. The solder connector terminals are mounted in through holes on the circuit board and soldered to corresponding terminals, as shown in FIG. 6.

The housing, which may specifically be a Positronic type GMCT-34-Z,V, has an access hood 140 enclosing the interior of the housing. The access hood is removed by removing screws (not shown) to release the hood from the housing. The hood must be removed to expose the data access terminals. These terminals may be recessed within the housing, as shown in FIG. 9 or may be located at the surface of the housing, exposed through an opening formed therein, as in FIGS. 3 and 8.

Figure 9:
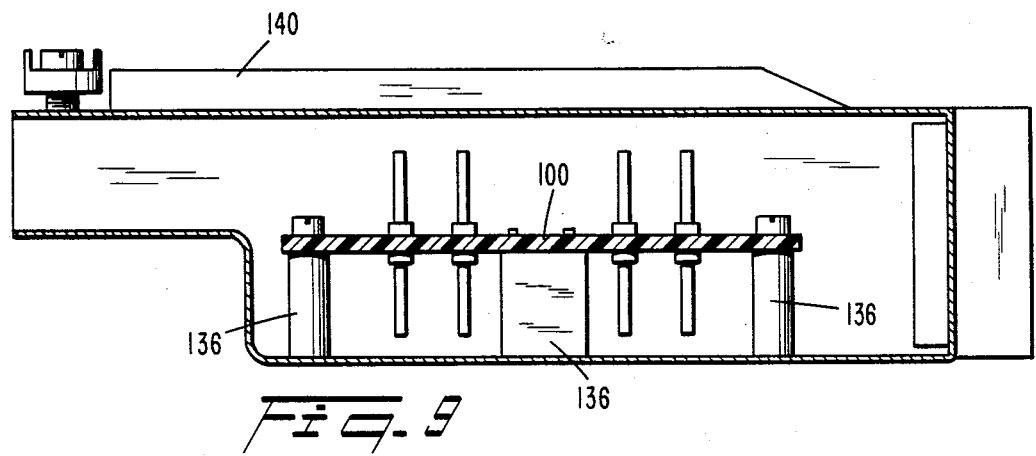
FIG. 9 is a side view of a data monitoring connector illustrating the circuit board and data access terminals.
Figure 10:
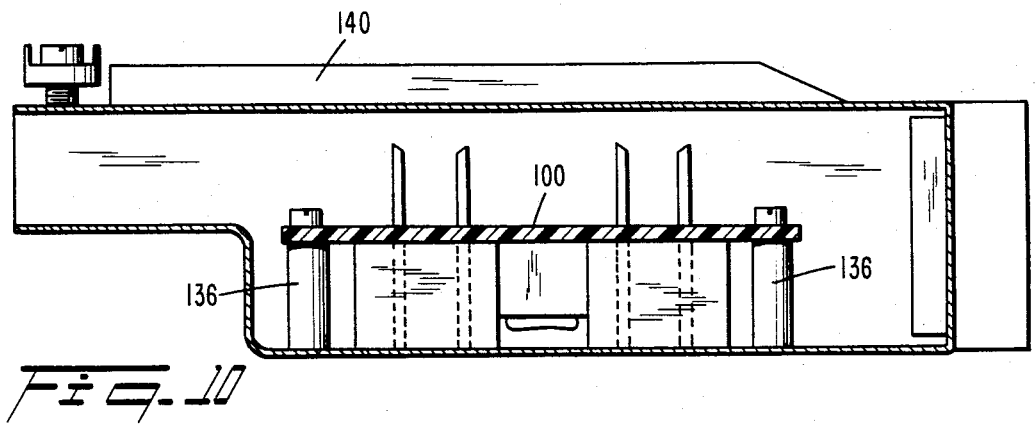
FIG. 10 is a cross-sectional side view of a data monitor and breaker, in accordance with the invention, showing the circuit board, access terminals and switches.

FIG. 10 is similar to FIG. 9 except that the DIP modular switches are connected to the underside of the printed circuit board.

In this disclosure, there is shown and described only the preferred embodiments of the invention, but as aforementioned, it is to be understood that the invention is capable of use in various other combinations and environments and is capable of changes or modifications within the scope of the inventive concept as expressed herein. For example, it is apparent that the data monitoring connector of the invention can be used to enable monitoring of interface data with the CPU on line, without opening the interface to insert a BERT or a breakout box. Connector monitoring terminals could, for example, be monitored by a dual trace oscilloscope to determine the clock and data phase relationships on various conductors of the interface, phase jitter, high and low status of signals on the various conductors and signal levels. Furthermore, LEDs can be temporarily or permanently coupled in circuit with the connector data monitoring terminals to provide a visual display of high and low status signals on selected conductors without requiring application of external instrumentation.

What is claimed is:

1. In an arrangement for testing data transmission links in a multiple cable, computer based system, a multiple conductor connector provided at least at one piece of equipment on one of the links to enable monitoriing of data flow during normal operation of the system, the connector comprising a housing, an electrical cable having multiple conductors extending from one end of said housing, a multiple conductor coupling including at least two rows of electrical coupling elements for connecting to corresponding conductors of a piece of equipment, a circuit board supported within said housing, said circuit board carrying a conductive pattern including conductors corresponding to said coupling elements; jumper wires for electrically interconnecting said at least two rows of coupling elements and said conductor pattern on one side of the circuit board; means for electrically interconnecting said cable conductors and said conductor pattern; and terminal means connected respectively to the conductors of said conductive pattern, which connect to said at least two rows of coupling elements, said circuit board spaced longitudinally apart from said coupling elements and said terminal means on said circuit board positioned to be accessed from a common side of said housing to monitor data signals, the connector remaining in circuit during normal operation of said system to enable continuous monitoring of said system by accessing data patterns on said link at said terminal means of said connector.

2. The connector of claim 1, wherein said housing is provided with an access opening and said terminal means includes a terminal block extending outwardly from said housing through said access opening.

3. The connector of claim 1, wherein said housing is provided with an access opening, and said terminal means is recessed within and exposed by said access opening.

4. The connector of claim 3, including a cover and means for releasably positioning said cover to enclose said access opening.

5. The connector of claim 3, wherein said terminal means provides conductive pins extending through said circuit board in electrical contact with corresponding 6. The connector of claim 1, including switch means in circuit with the conductors of said circuit board for selectively conducting data signals between said coupler elements and the equipment.

7. The connector of claim 6, wherein said switch means includes a plurality of switch modules mounted on said circuit board in electrical contact with corresponding printed conductors.

8. The connector of claim 1, including second terminal means in said circuit board, providing discontinuities in said conductive pattern said second terminal means adapted to receive jumper conductors for connecting across said discontinuities.

9. The connector of claim 8, including switch means in said housing for selectively establishing electrical connections across said discontinuities.

10. The connector of claim 9, wherein said switch means includes modular switch elements mounted on said circuit board.

11. The connector of claim 1, including at least three rows of electrical coupling elements, and wherein said interconnecting means includes means for interconnecting said at least three rows of coupling elements and said conductive pattern.

* * * * *